(12) United States Patent
Weller et al.

(10) Patent No.: US 6,373,260 B1
(45) Date of Patent: *Apr. 16, 2002

(54) SINGLE CABLE, SINGLE POINT, STIMULUS AND RESPONSE PROBING SYSTEM AND METHOD

(75) Inventors: Dennis J. Weller, Colorado Springs; Robert H. Noble, Longmont, both of CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,910

(22) Filed: Feb. 24, 1998

(51) Int. Cl.[7] .............................................. G01R 27/28
(52) U.S. Cl. ....................................... 324/627; 324/603
(58) Field of Search ................................ 324/754, 603, 324/605, 609, 612, 72.5, 158.1, 627

(56) References Cited

U.S. PATENT DOCUMENTS

| 3,651,403 A | * | 3/1972 | Fluck | 455/4.1 |
|---|---|---|---|---|
| 3,790,767 A | * | 2/1974 | Alexander | 235/151 |
| 4,038,598 A | * | 7/1977 | Kapfer | 324/72.5 |
| 4,910,458 A | * | 3/1990 | Forsyth et al. | 324/158 |
| 5,164,663 A | * | 11/1992 | Alcorn | 324/73.1 |
| 5,396,168 A | * | 3/1995 | Heep et al. | 324/115 |
| 5,412,330 A | * | 5/1995 | Ravel et al. | 324/753 |
| 5,420,500 A | * | 5/1995 | Kershner | 324/72.5 |
| 5,438,272 A | * | 8/1995 | Craig et al. | 324/537 |
| 5,450,015 A | * | 9/1995 | Mastico et al. | 324/665 |
| 5,479,104 A | * | 12/1995 | Cambell | 324/690 |
| 5,530,370 A | * | 6/1996 | Rogers | 324/627 |
| 5,539,306 A | * | 7/1996 | Riggio | 324/158.1 |
| 5,625,288 A | * | 4/1997 | Snyder et al. | 324/158.1 |
| 5,689,192 A | * | 11/1997 | Rogers | 324/627 |
| 5,844,412 A | * | 12/1998 | Norton | 324/548 |

* cited by examiner

*Primary Examiner*—Safet Metjahic
*Assistant Examiner*—Vincent Q. Nguyen

(57) ABSTRACT

A single cable, single point stimulus and response probing system allows the measurement of both low impedance stimulus measurements and high impedance response measurements using a single probe cable. Circuitry located within the probe cable receives stimulus input from the stimulus circuitry located within a test and measurement device, and delivers input to response measurement circuitry also located within the test and measurement device. Certain embodiments of the probing system use feedback supplied to an amplifier located within the stimulus circuitry to improve the accuracy of the measurement device and control output impedance. Feedback can be locally supplied from the output of the stimulus circuitry, or can be generated using an additional amplifier located within the response measurement circuitry.

13 Claims, 7 Drawing Sheets

SINGLE CABLE, SINGLE POINT, STIMULUS AND RESPONSE PROBING SYSTEM AND METHOD

FIELD OF THE INVENTION

The present invention relates generally to test and measuring equipment, and more particularly, to a single cable, single point, stimulus and response probing system and method for use in test and measuring equipment.

BACKGROUND OF THE INVENTION

Circuit testing is an indispensable part of circuit design, circuit analysis, and circuit troubleshooting. Many devices are available which perform various testing functions. For example, digital multimeters, oscilloscopes, and logic analyzers are a few of the devices in use that perform various circuit testing functions, including but not limited to voltmeter functions such as voltage, resistance, and continuity; component testing functions such as diode operation, capacitance, and inductance; analyzing a logic circuit; pulse sine and arbitrary waveform generation; and frequency counting. Typically, circuit testing involves providing a stimulus to a circuit and then measuring a response. Voltmeter functions and component testing are examples of stimulus measurements, while logic analyzer and oscilloscope measurements are examples of response measurements.

Typically, a coaxial cable connects a device under test (DUT) to the stimulus and response test and measurement device. The DUT can be any circuit, component, or logic device to be analyzed or tested. Examples are discrete components such as resistors, capacitors, diodes; integrated circuit components including application specific integrated circuits (ASICs); and logic circuitry. The aforementioned single cable arrangement presents a large capacitive load (typically greater than 100 pF) to the DUT, limiting measurement to a restricted bandwidth. For higher bandwidth measurements, two coaxial cables have typically been required. One cable connects the stimulus source to the DUT, while a separate cable connects the DUT to the response measurement circuitry. This arrangement allows the measurement of higher bandwidth signals, but requires the user to manage multiple sets of test cables.

Typically, in higher bandwidth applications, the stimulus output is low impedance (50 or 75 ohms typical), and therefore, a low impedance connection is required between the stimulus source and the DUT. In order to achieve higher bandwidth response measurements, the connection between the DUT and the response measurement circuitry is high impedance (typically 100K–10M ohms, <20 pF), so as to prevent or minimize distortion of the signal being measured. Loading the DUT this way is generally acceptable for measuring frequencies up to approximately 500 MHz. This arrangement typically places in the tip of the probe cable components that electrically isolate the capacitive loading of the cable from the DUT. However, these components in the probe tip generally add impedance between the DUT and the test equipment, making this cable unusable for connecting stimulus circuitry to the DUT, Therefore, it would be desirable to provide a single test cable capable of allowing both low impedance stimulus measurement and high impedance response measurements in high bandwidth applications.

SUMMARY OF THE INVENTION

The present invention provides an improved probing system and method used with test and measurement equipment. The single cable, single point, stimulus and response probing system disclosed herein is applicable to hand held test equipment and to any test or measurement device that measures both high and low impedance circuits.

The present invention is a probing system and method capable of both low impedance stimulus measurements and high impedance response measurements, the probing system comprising a cable, stimulus circuitry configured to supply a first stimulus signal to the cable, and response circuitry configured to receive an output of the cable. The cable is essentially two signal wires and a ground shield. In a first embodiment, the cable includes a first diode and a resistor at or near the probe tip.

A second embodiment of the probing system adds an additional diode and signal wire to the cable, and adds multiple embodiments of the stimulus circuitry. A first embodiment of the stimulus circuitry is configured to deliver a first stimulus signal to both diodes located within the probe. As in the first embodiment, response circuitry is configured to receive an output of the cable.

A second embodiment of the stimulus circuitry adds a push-pull amplifier circuit and two additional diodes to the stimulus circuitry, the additional circuitry configured to deliver to the first amplifier a local feedback signal. The local feedback signal is taken from the output of the stimulus circuitry.

A third embodiment of the stimulus circuitry includes the push-pull amplifier of the previous embodiment and adds a second amplifier, located within the response circuitry. The second amplifier is configured to receive as input a signal from the probe, buffer that signal, and deliver it as loop feedback to the first amplifier located within the stimulus circuitry. The loop feedback signal is representative of the voltage signal located at the probe tip, but is buffered by the second amplifier before delivery to the first amplifier.

A fourth embodiment of the stimulus circuit eliminates the push-pull amplifier circuitry and relies on the output of the first amplifier to draw sufficient current to drive the diodes located in the probe.

The present invention can also be conceptualized as providing a method for providing stimulus to a single cable probing system, the probing system capable of both low impedance stimulus measurements and high impedance response measurements, comprising the following steps. First, a stimulus signal is supplied to a probe cable, the probe cable including a first diode and a resistor. Next, a response signal is received in response circuitry, the response signal being supplied from the probe cable. In a second embodiment, a second diode is added to the probe cable.

The invention has numerous advantages, a few of which are delineated hereafter, as merely examples.

An advantage of the single cable, single point, stimulus and response probing system and method is that it provides the ability to perform both low impedance stimulus measurements and high impedance response measurements using a single probe cable.

Another advantage of the single cable, single point, stimulus and response probing system and method is that it by using a single cable it reduces the complexity and amount of time required to perform various circuit and component test and measurement functions.

Another advantage of the single cable, single point, stimulus and response probing system and method is that it permits the testing and measurement of many passive devices and active circuit elements.

Another advantage of the single cable, single point, stimulus and response is probing system and method is that it permits the testing and measurement of circuits.

Another advantage of the single cable, single point, stimulus and response probing system and method is that it is simple in design, reliable in operation, and its design lends itself to economical mass production.

Another advantage of the single cable, single point, stimulus and response probing system and method is that it lends itself to implementation on an application specific integrated circuit (ASIC) for economical mass production.

Other features and advantages of the present invention will become apparent to one with skill in the art upon examination of the following drawings and detailed description. It is intended that all such additional features and advantages be included herein within the scope of the present invention, as defined in the appended claims.

BRIEF DESCRIPTION OF THE DRAWINGS

The present invention, as defined in the claims, can be better understood witch reference to the following drawings. The components within the drawings are not necessarily to scale relative to each other, emphasis instead being placed on clearly illustrating the principles of the present invention.

DETAILED DESCRIPTION OF THE PREFERRED EMBODIMENT

The single cable, single point stimulus and response probing system and method of the present invention can be implemented using discrete components or implemented on an application specific integrated circuit (ASIC). Furthermore, the single cable, single point, stimulus and response probing system can be used in connection with any testing and measurement application that can benefit from a single cable probing system, for example, but not limited to a hand-held multimeter, an oscilloscope, a frequency counter, or a circuit analyzer.

Figure 1:
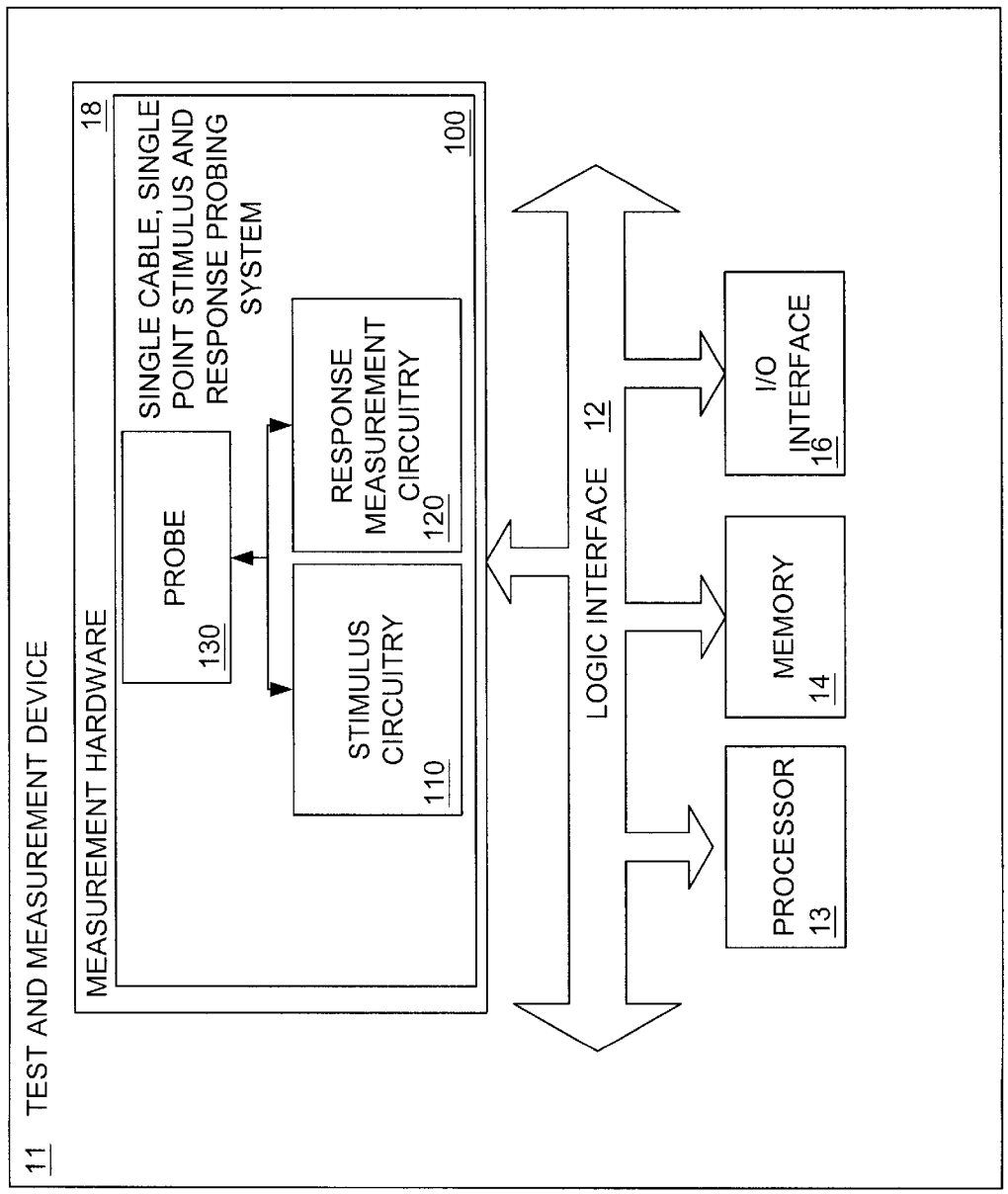
FIG. 1 is a block diagram illustrating a test and measurement device containing the single cable, single point, stimulus and response probing system described herein.

Referring now to FIG. 1, shown is a block diagram of a test and measurement device 11 containing the single cable, single point, stimulus and response probing system 100 of the present invention. Test and measurement device 11 can be for example, but not limited to, a digital multimeter, volt-ohm meter, logic probe, frequency counter, oscilloscope, or any device capable of performing either circuit or component analysis and measurement functions. Measuring device 11 contains components that are known to those skilled in the art of test and measurement devices. Measuring device 11 contains, among other items, logic interface 12, over which processor 13, memory 14, and I/O interface 16 communicate. Also in communication with logic interface 12 is measurement hardware 18.

Contained within measurement hardware 18 is the single cable, single point stimulus and response probing system 100, hereafter referred to as probing system 100. Probing system 100 further includes stimulus circuitry 110, response measurement circuitry 120, and probe 130. Illustratively, probe 130 is the probe cable which includes components that will be described in detail hereafter. Stimulus circuitry 110 and response measurement circuitry 120 also communicate over logic interface 12. The aforementioned items within probing system 100 together form the present invention.

Figure 2:
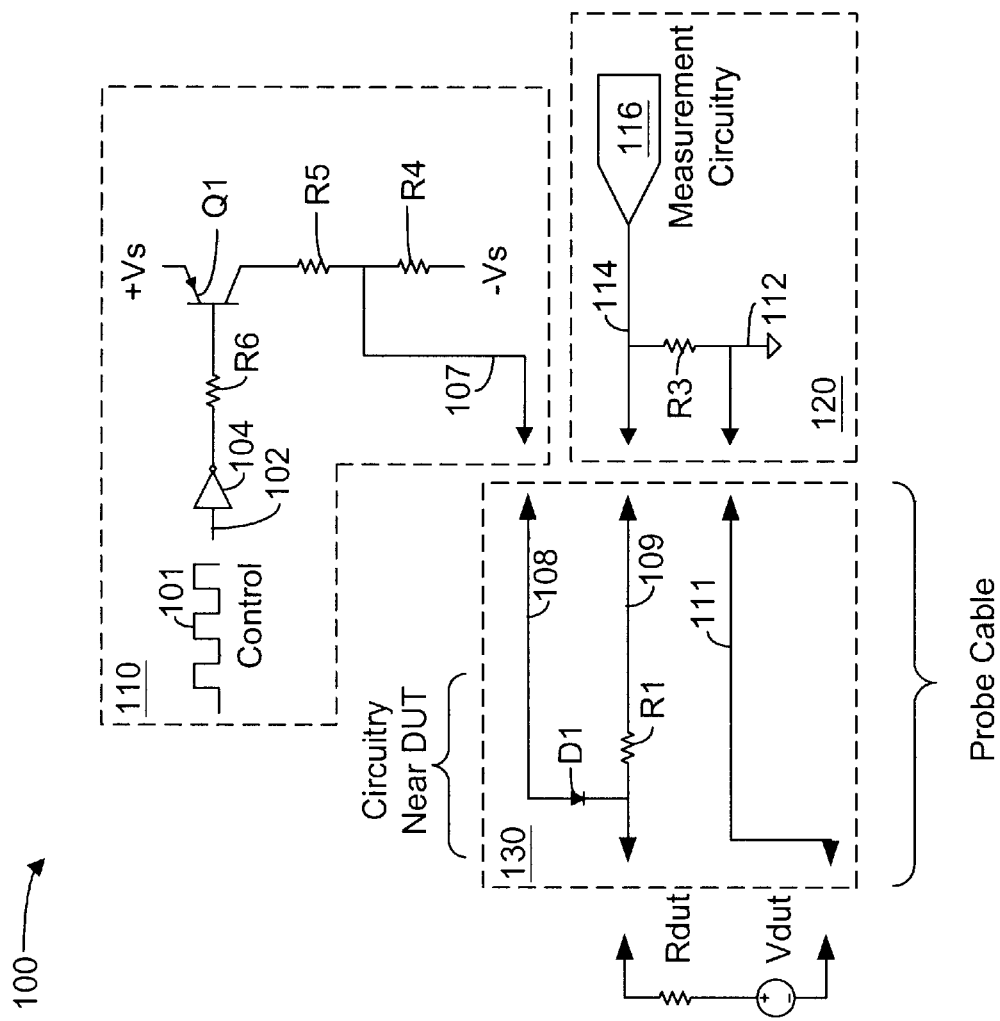
FIG. 2 is a schematic view of a first embodiment of the single cable, single point, stimulus and response probing system of FIG. 1.

With reference to FIG. 2, shown is a schematic view, illustrating with discrete components, a first embodiment of the single cable, single point, stimulus and response probing system 100 of FIG. 1. Probe 130 is illustratively a cable comprising signal wires 108 and 109. Also included, is ground shield 111. At the probing end of the cable, i.e., the end that connects to a device under test (DUT), are diode D1 in wire 108 and resistor R1 in wire 109. Resistor R1 connects the DUT (herein illustrated with resistor $R_{DUT}$ and voltage source $V_{DUT}$) to the measurement circuitry 116 located within response measurement circuitry 120. Measurement circuitry 116 is typically circuitry that performs analog to digital conversion and analysis of the probed signal delivered on line 114 as known in the art. Resistor R1 forms a voltage divider with resistor R3 and isolates the DUT from the capacitive loading of signal wire 109. Ground shield 111 and resistor R3 are connected to ground 112.

A diode, D1, connects through wire 108 to stimulus circuitry 110 on line 107. In this embodiment, stimulus circuitry 110 acts as a current source comprising transistor Q1, and resistors R4, R5, and R6. Illustratively, transistor Q1 is a bipolar junction transistor operating in PNP mode. For measurement functions that do not require stimulus, transistor Q1 is switched off via control signal 101. Control signal 101 can be any high/low pulse waveform input and is supplied to Q1 through line 102 to inverting buffer 104, which delivers the signal through base resistor R6. When control signal 101 is low, or off, diode D1 is reverse biased by resistor R4, which is connected to voltage source -Vs. This arrangement allows probing system 100 to function as a voltmeter and/or oscilloscope measuring voltage $V_{DUT}$ at the DUT. Because diode D1 is reverse biased, it does not present a significant load to the DUT.

If transistor Q1 is made active by control signal 101 going high, current will flow from voltage+Vs through Q1 and resistor R5 through line 107 and wire 108 to the diode D1, and thus through the DUT. In this state, by providing a voltage stimulus, probing system 100 can be used to perform continuity, resistance, capacitance, and diode voltage drop measurements. The resistance of $R_{DUT}$ is determined by measuring the voltage across the DUT and dividing that voltage by the current being supplied through transistor Q1. Illustratively, the capacitance of the DUT can be calculated by measuring the speed of the voltage increase in the DUT and calculating the capacitance by the following equation: $C = I \cdot dt/dV$.

Figure 3:
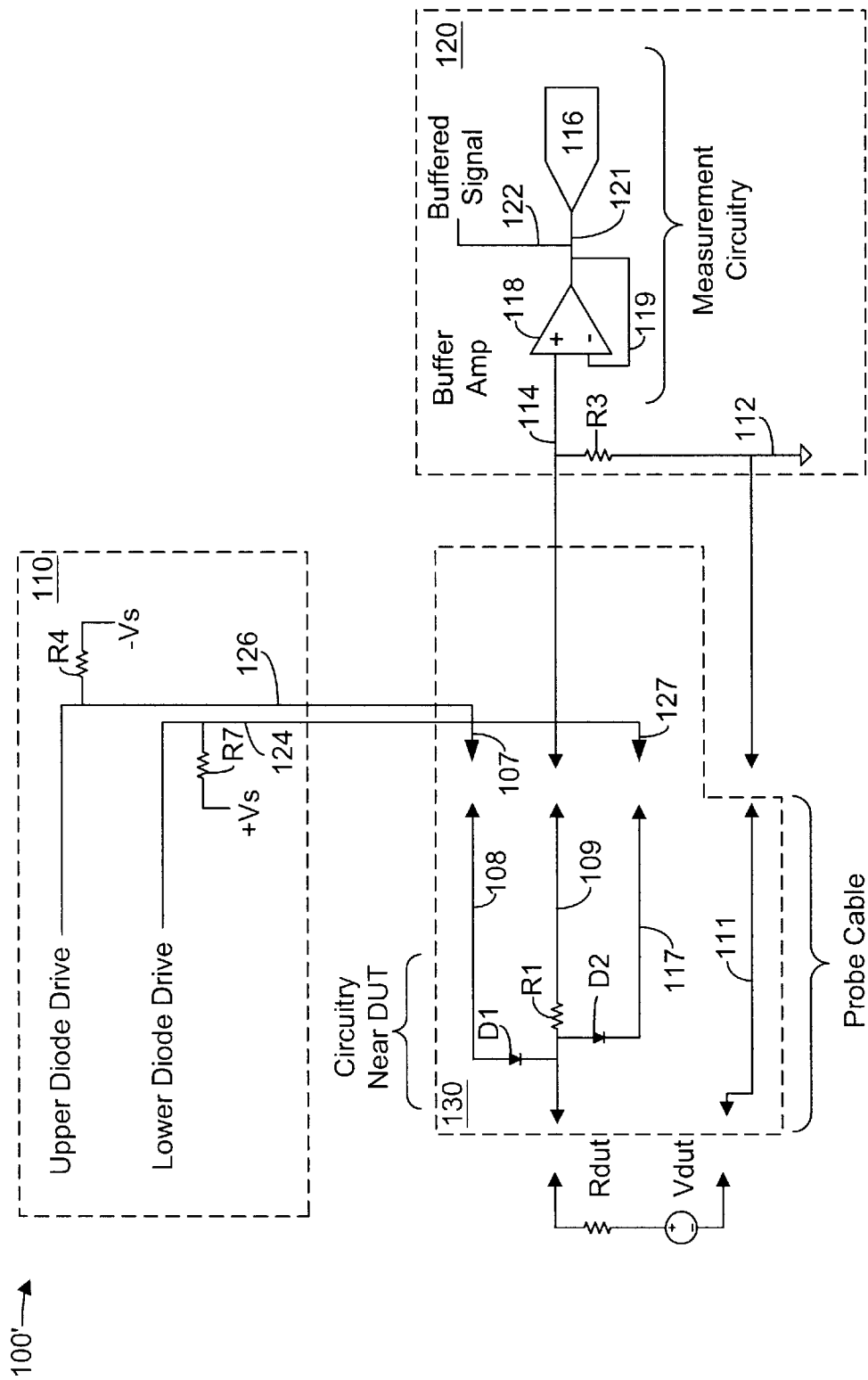
FIG. 3 is a schematic view of an alternate embodiment of the single cable, single point, stimulus and response probing system of FIG. 2.
Figure 4:
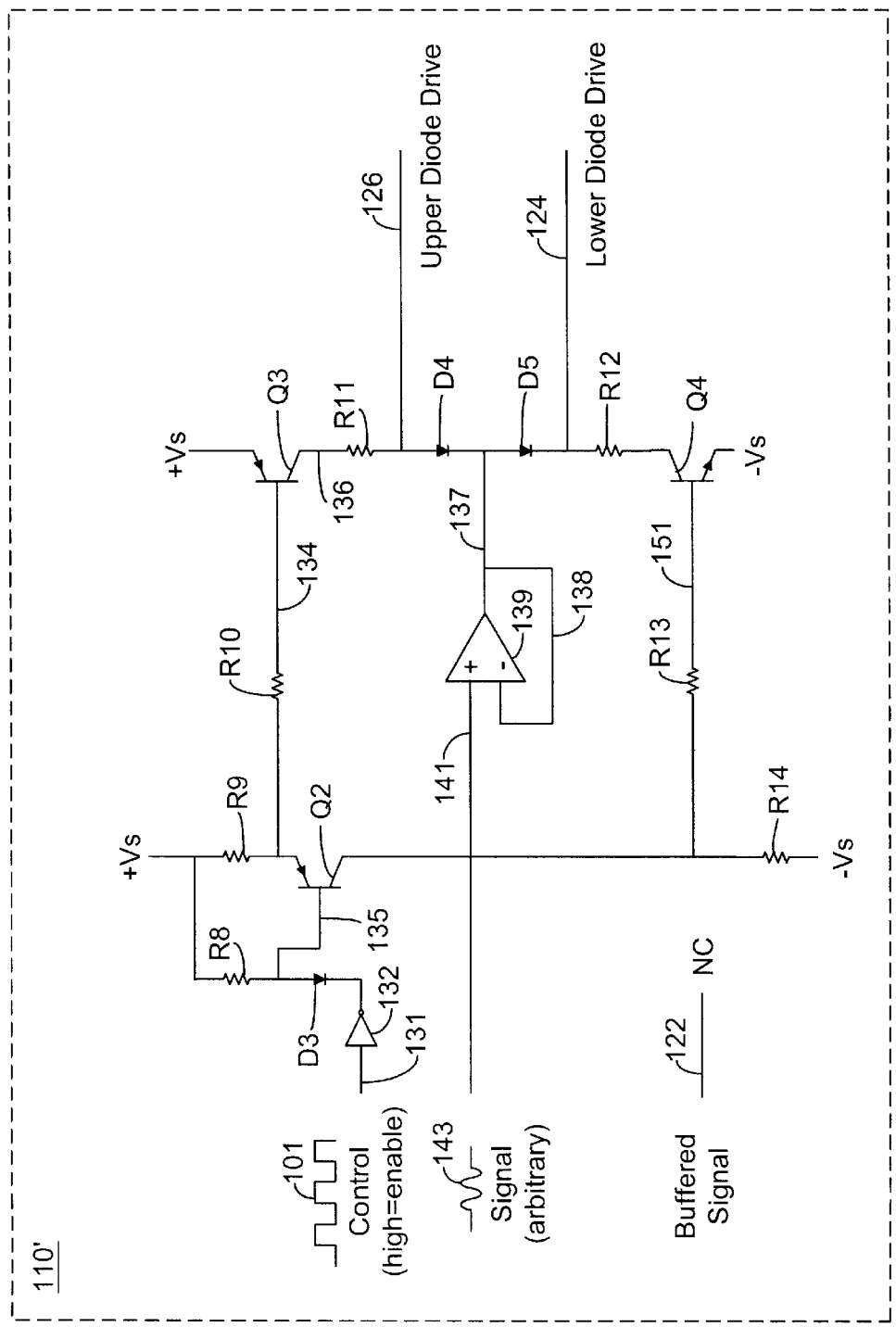
FIG. 4 is a schematic view illustrating a second embodiment of the stimulus circuitry used by the single cable, single point, stimulus and response probing system of FIG. 3.

Referring now to FIGS. 3 and 4, shown is a schematic view of an alternative embodiment 100' of the single cable, single point, stimulus and response probing system of FIG. 2 and the stimulus circuitry 110 used to drive diodes D1 and D2 of FIG. 3 in probe 130. This embodiment permits probing system 100 to function as a stimulus output. Added to probe 130 of FIG. 2 is an additional diode D2 on line 117, and added to stimulus circuitry 110 are reverse bias resistor R4 connected to voltage −Vs and R7 connected to voltage +Vs.

Also added to response measurement circuitry 120 is buffer amplifier 118. Buffer amplifier 118 receives input from probe 130 on line 114, and supplies a buffered signal output on line 122. The buffered signal represents a buffered voltage signal present at the probe tip and is used as feedback by certain alternative embodiments of stimulus circuitry 110 and will be explained in detail hereafter. Buffer amplifier 118 also receives local feedback to its inverting input on line 119. In this embodiment, measurement circuitry 116 receives input through buffer amplifier 118 on line 121. All remaining components have the same function as in FIG. 2.

Referring now to FIG. 4, shown is a schematic view illustrating a second embodiment of the stimulus circuitry 110' used by the single cable, single point, stimulus and response probing system of FIG. 3. An operational amplifier (op amp) 139 is used to drive diodes D1 and D2 of FIG. 3 on upper diode drive line 126 and lower diode drive line 124, respectively. When transistors Q2, Q3 and Q4 are off, i.e., control signal 101 is low, diodes D4 and D5 are reverse biased by resistors R4 and R7 of FIG. 3. This effect causes diodes D1 and D2 to also be reverse biased, which in turn causes probe 130 to function as a high impedance response unit, Illustratively, transistors Q2, Q3, and Q4 are bipolar junction transistors with transistors Q2 and Q3 operating in PNP mode similar to transistor Q1, and transistor Q4 operating in NPN mode.

When control signal 101 goes high and activates the base connections of transistors Q2, Q3 and Q4 on lines 135, 134, and 151, respectively, diodes D4 and D5, and thus diodes D1 and D2 become forward biased. Because diodes D4, D5, D1, and D2 are now forward biased, op amp 139 drives lines 126 and 124 with stimulus signal 143 supplied on line 141. The stimulus signal can be any signal that is to be delivered to probe 130 on lines 108 and 117 and is illustratively a sine or pulse wave.

Figure 5:
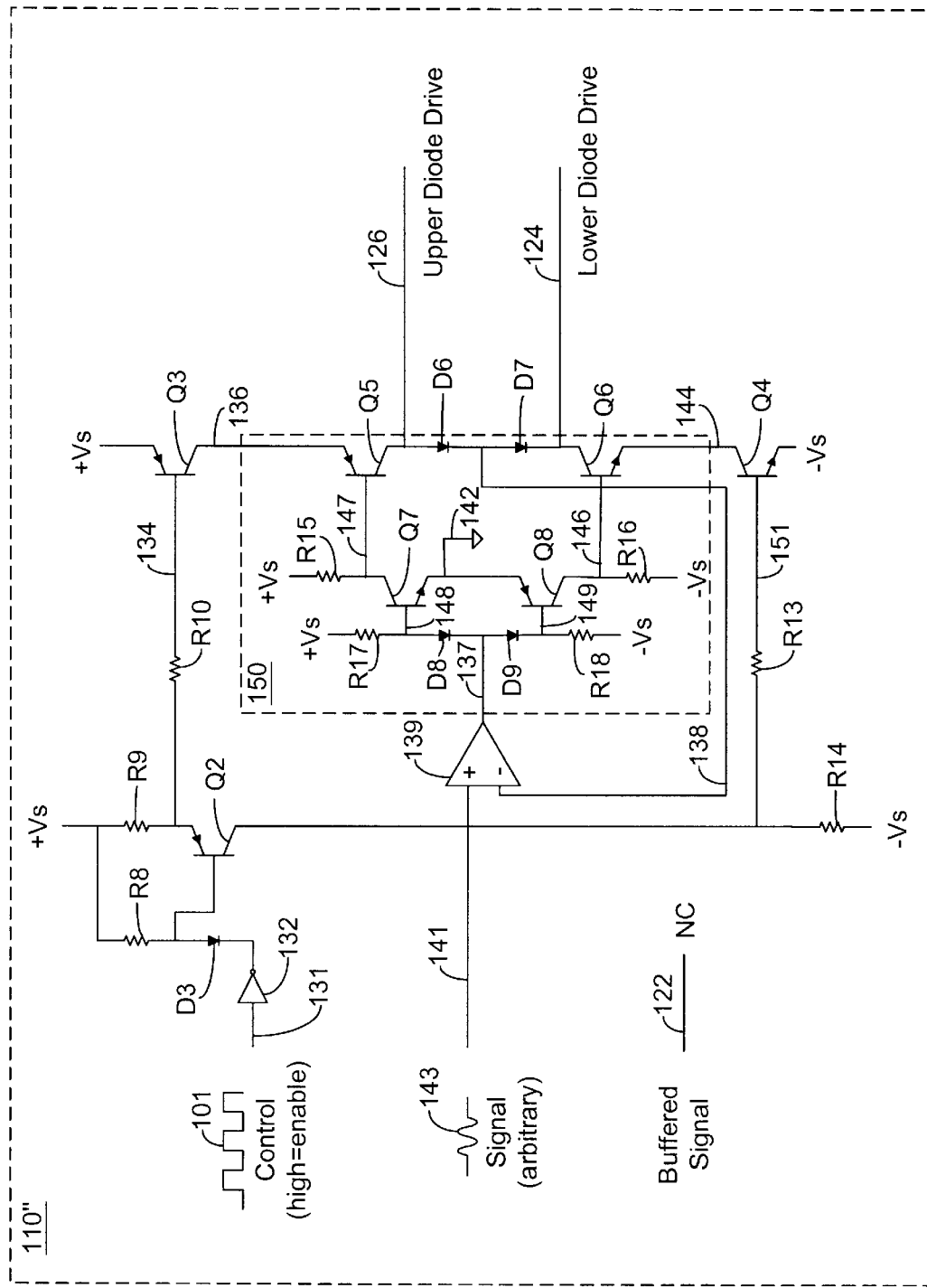
FIG. 5 is a schematic view illustrating a third embodiment of the stimulus circuitry of the single cable, single point, stimulus and response probing system of FIG. 3.

With reference now to FIG. 5, shown is a schematic view illustrating a third embodiment of the stimulus circuitry 110" of the single cable, single point, stimulus and response probing system of FIG. 3. The embodiment of stimulus circuitry 110" shown in FIG. 5 improves upon that shown in FIG. 4 by adding local feedback, delivered from the output of diodes D6 and D7, on line 138 to op amp 139. Transistors Q5, Q6, Q7 Q8, diodes D6–D9, and resistors R15–R18 are added, which form a push-pull amplifier stage 150. Local feedback is derived from the output of push-pull amplifier 150 at diodes D6 and D7, and supplied on line 138 to the inverting input of op amp 139. The output of op amp 139 on line 137 is fed through push-pull amplifier circuit 150, via diodes D8 and D9. Transistors Q5–Q8 are also bipolar junction transistors with Q5 and Q8 operating in PNP mode and Q6 and Q7 operating in NPN mode. Transistors Q7 and Q8 are connected to ground 142. The feedback signal on line 138 closely matches the signal supplied to probe 130 via upper diode drive line 126 and lower diode drive line 124. The operation of the remaining components of FIG. 6 is similar to that described with respect to FIG. 4.

Figure 6:
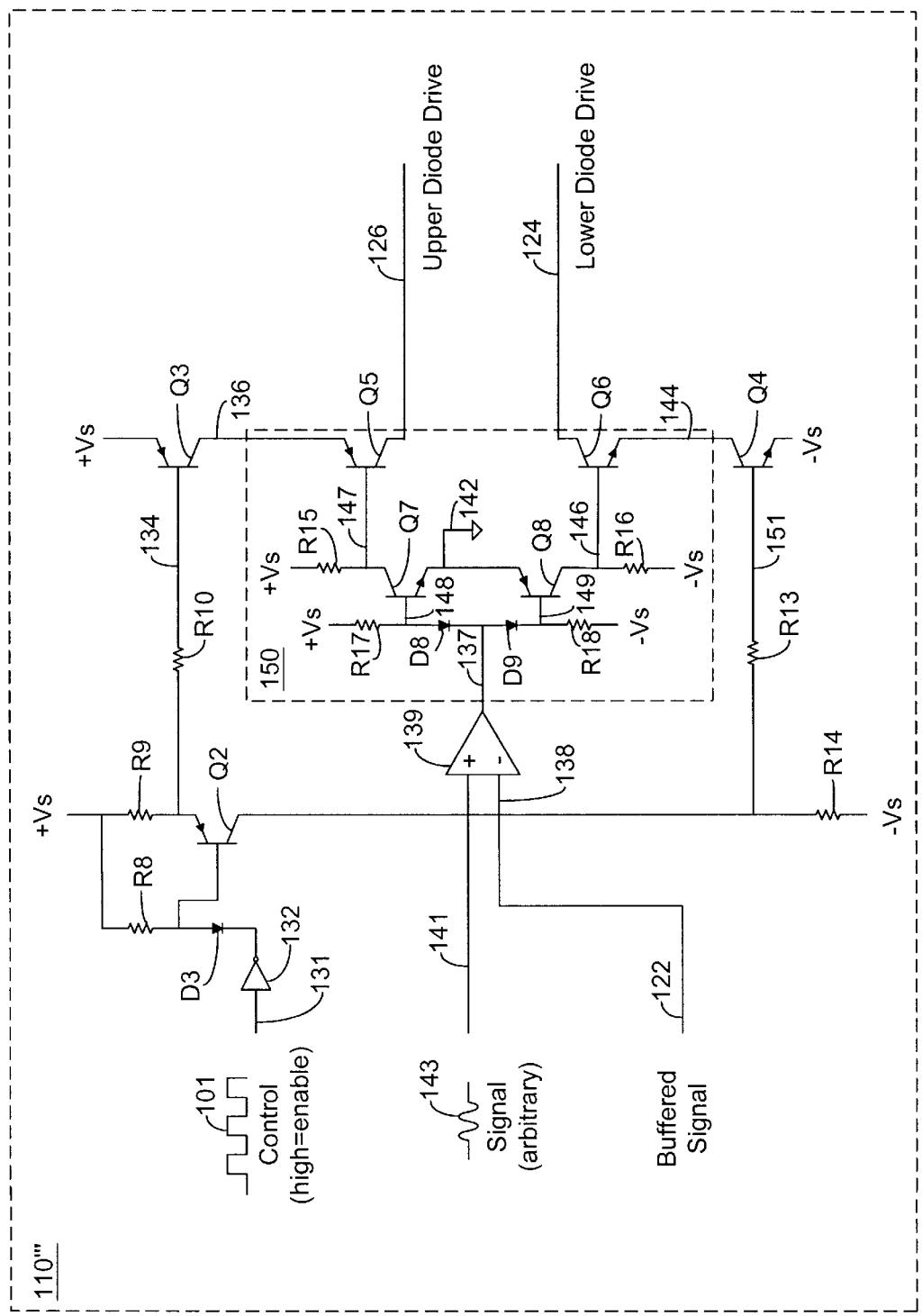
FIG. 6 is a schematic view illustrating a fourth embodiment of the stimulus circuitry of the single cable, single point, stimulus and response probing system of FIG. 3.

Referring now to FIG. 6, shown is a schematic view illustrating a fourth embodiment of the stimulus circuitry 110'" of the single cable, single point, stimulus and response probing system of FIG. 3. This alternative embodiment uses the buffered feedback signal developed by buffer amplifier 118 of FIG. 3 to supply on line 122 a loop feedback signal input to the inverting input 138 of op amp 139. This buffered loop feedback signal improves the accuracy of the measurement device and functions to control output impedance. As can be seen in FIG. 6, diodes D6 and D7 have been omitted because local feedback is no longer required. The operation of the remaining components of FIG. 6 is similar to that described with respect to FIGS. 4 and 5.

Figure 7:
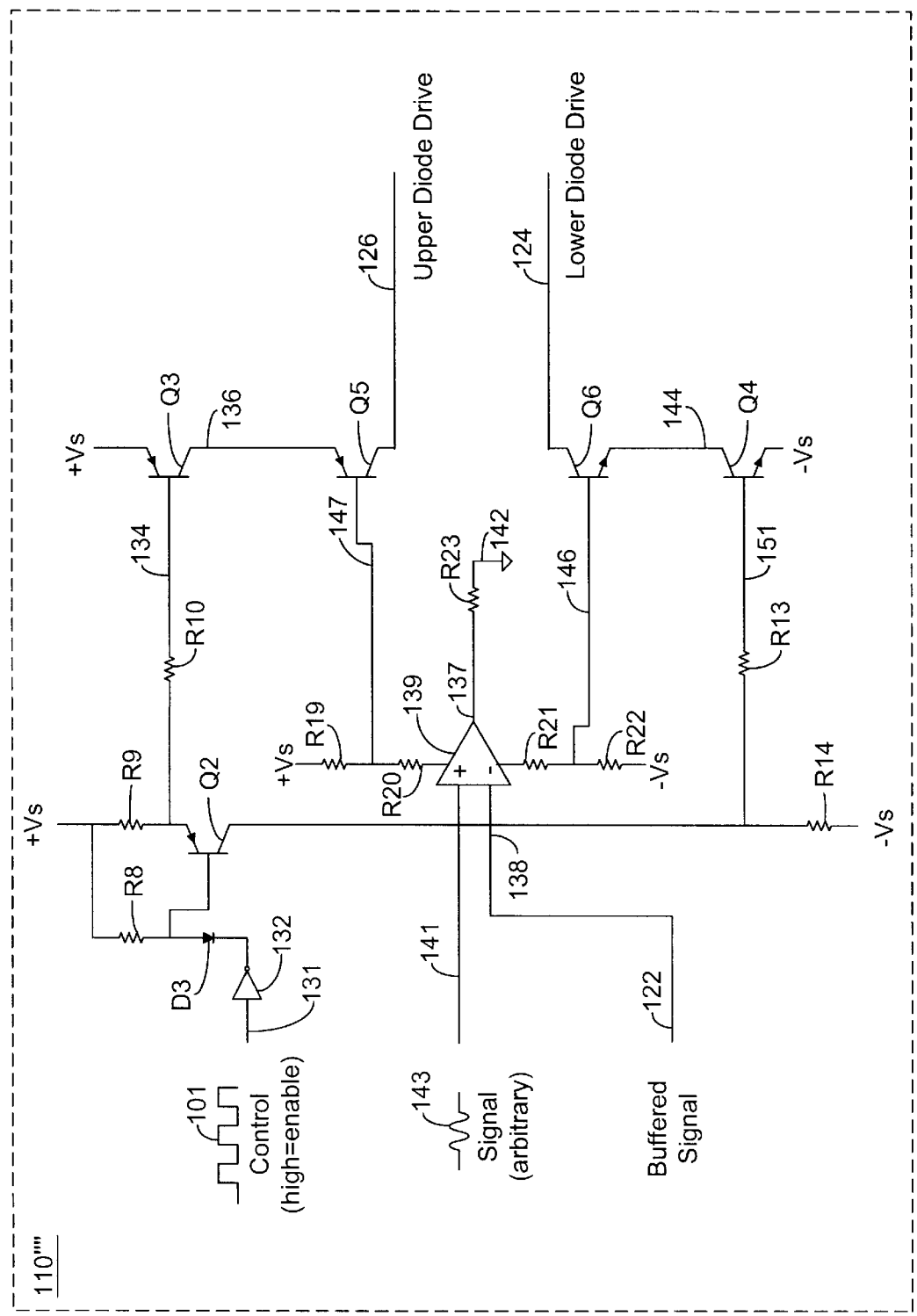
FIG. 7 is a schematic view illustrating a fifth embodiment of the stimulus circuitry of the single cable, single point, stimulus and response probing system of FIG. 3.

Referring now to FIG. 7, shown is a schematic view illustrating a fifth embodiment of the stimulus circuitry 110"" of the single cable, single point, stimulus and response probing system of FIG. 3. This alternative embodiment improves upon that disclosed with respect to FIG. 6 in that it reduces the number of components required to drive diodes D1 and D2. Omitted are transistors Q7, Q8, D8, D9, and resistors R15–R18. Added are resistors R19–R23. When stimulus signal 143 on line 141 increases in magnitude, the output of op amp 139 on line 137 increases, thus supplying more current to ground 142 through resistor R23. This increases the current draw from +Vs through resistors R19 and R20. This causes line 147 (the base input of transistor Q5) to be pulled down, which in turn causes transistor Q5 to supply more current to diode D1 via upper diode drive line 126 and wire 108, and thus, to the DUT through probe 130.

It will be obvious to those skilled in the art that many modifications and variations may be made to the preferred embodiments of the present invention, as set forth above, without departing substantially from the principles of the present invention. For example, the circuitry used to form the stimulus circuitry and the response measurement circuitry can be implemented on an application specific integrated circuit (ASIC). All such modifications and variations are intended to be included herein within the scope of the present invention, as defined in the claims that follow.

What is claimed is:

1. A probing system capable of both low impedance stimulus measurements and high impedance response measurements, comprising:

a cable, including a first diode and a resistor;

stimulus circuitry coupled to said first diode and configured to supply a first stimulus signal to said cable, the stimulus circuitry causing said first diode to conduct said first stimulus signal to a point associated with a device under test; and response circuitry coupled to said resistor and configured to receive an output of said cable when said stimulus circuitry causes said first diode to present a high impedance to said point associated with said device under test.

2. The system of claim 1, further comprising:

first circuitry, located within said stimulus circuitry, said first circuitry configured to supply said first stimulus signal to said first diode.

3. The system of claim 2, further comprising:

a second diode located within said cable, said second diode configured to receive said first stimulus signal from said first circuitry.

4. A probing system capable of both low impedance stimulus measurements and high impedance response measurements, comprising:

a cable including a first diode, a second diode, and a resistor;

stimulus circuitry coupled to said first diode and said second diode and configured to supply a first stimulus signal to said first diode and said second diode, causing said first diode and said second diode to conduct said first stimulus signal to a point associated with a device under test;

a first amplifier located within said stimulus circuitry for providing said first stimulus signal to said first diode and said second diode; and response circuitry configured to receive an output of said cable when said stimulus circuitry causes said first diode to present a high impedance to said point associated with said device under test.

5. The system of claim 4, further comprising:

a first signal wire located within said cable;

a second signal wire located within said cable;

a third signal wire located within said cable; and a ground shield located within said cable.

6. A probing system capable of both low impedance stimulus measurements and high impedance response measurements, comprising:

means for supplying a first stimulus signal to a probe cable, said probe cable including a first diode and a resistor, said first stimulus signal causing said first diode to conduct said first stimulus signal to a point associated with a device under test; and means for receiving, with response circuitry coupled to said first diode, a response signal from said probe cable when said first stimulus signal causes said first diode to present a high impedance to said point associated with said device under test.

7. The system of claim 6, further comprising means for supplying said first stimulus signal to a second diode located within said probe cable.

8. A probing system capable of both low impedance stimulus measurements and high impedance response measurements, comprising:

means for supplying a first stimulus signal to a probe cable, said probe cable including a first diode, a second diode and a resistor, said first stimulus signal causing said first diode and said second diode to conduct said first stimulus signal to a point associated with a device under test; and means for receiving, with response circuitry coupled to said first diode and said second diode, a response signal from said probe cable when said first stimulus signal causes said first diode to present a high impedance to said point associated with said device under test.

9. The system of claim 8, wherein said first stimulus signal is supplied by a first amplifier.

10. A method for providing stimulus to a single cable probing system, the probing system capable of both low impedance stimulus measurements and high impedance response measurements, the method comprising the steps of:

supplying a first stimulus signal to a probe cable, said probe cable including a first diode, a second diode and a resistor, said first stimulus signal causing said first diode and said second diode to conduct said first stimulus signal to a point associated with a device under test; and receiving, with response circuitry coupled to said first diode and said second diode, a response signal from said probe cable when said first stimulus signal causes said first diode to present a high impedance to said point associated with said device under test.

11. The method of claim 10, wherein said first stimulus signal is supplied by a first amplifier.

12. A method for providing stimulus to a single cable probing system, the probing system capable of both low impedance stimulus measurements and high impedance response measurements, the method comprising the steps of:

supplying a first stimulus signal to a probe cable, said probe cable including a first diode and a resistor, said first stimulus signal causing said first diode to conduct said first stimulus signal to a point associated with a device under test; and receiving, with response circuitry coupled to said first diode, a response signal from said probe cable when said first stimulus signal causes said first diode to present a high impedance to said point associated with said device under test.

13. The method of claim 12, further comprising the step of:

supplying said first stimulus signal to a second diode located within said probe cable.

* * * * *